US006390231B1

(12) United States Patent
Howze

(10) Patent No.: US 6,390,231 B1
(45) Date of Patent: May 21, 2002

(54) LOUDSPEAKER WITH DIRECTED AIRFLOW COOLING

(75) Inventor: Bruce Howze, Broomall, PA (US)

(73) Assignee: Community Professional Loudspeakers, Chester, PA (US)

(*) Notice: Subject to any disclaimer, the term of this patent is extended or adjusted under 35 U.S.C. 154(b) by 0 days.

(21) Appl. No.: 09/850,974

(22) Filed: May 8, 2001

(51) Int. Cl.$^7$ .................................................. H05K 5/00
(52) U.S. Cl. ........................ 181/148; 181/153; 181/199
(58) Field of Search ................................ 181/148, 150, 181/153, 198, 199

(56) References Cited

U.S. PATENT DOCUMENTS 4,590,332 A 5/1986 Delbuck
4,757,547 A 7/1988 Danley
4,933,975 A 6/1990 Button
5,042,072 A 8/1991 Button
5,357,586 A 10/1994 Nordschow et al.
5,426,707 A 6/1995 Wijnker
5,497,428 A 3/1996 Rojas
5,533,132 A 7/1996 Button
5,748,760 A 5/1998 Button
5,792,999 A * 8/1998 Arnold et al. .............. 181/141
5,909,015 A 6/1999 Yamamoto et al.
5,940,522 A 8/1999 Cahill et al.

* cited by examiner

*Primary Examiner*—Shih-Yung Hsieh
(74) *Attorney, Agent, or Firm*—Akin, Gump. Strauss, Hauer & Feld, L.L.P.

(57) ABSTRACT

A loudspeaker comprises a speaker frame and a diaphragm connected to the speaker frame for reciprocal movement relative thereto. A generally tubular former is connected to the diaphragm, and a voice coil is connected to the former at a location spaced from the diaphragm. The former is constructed of a thermally conductive material for conducting heat away from the voice coil. An airflow director is positioned at least partially in the former, with a first gap being formed between the airflow director and an inner surface of the former and a second gap being formed between the airflow director and the pole piece. The first and second gaps are in fluid communication with each other and the pole vent opening such that movement of the diaphragm causes airflow through the first and second gaps and the pole vent opening. With this construction, heat generated in the coil during operation of the loudspeaker is transferred to the former through conduction, and heat present in the former is transferred through the first and second gaps and the pole vent opening through convection to thereby cool the loudspeaker.

18 Claims, 5 Drawing Sheets

LOUDSPEAKER WITH DIRECTED AIRFLOW COOLING

BACKGROUND OF THE INVENTION

This invention relates in general to loudspeakers which produce sound in response to an audio signal, and more particularly to a loudspeaker with an improved air cooling system.

Conventional loudspeakers typically employ a diaphragm which is vibrated by an electromechanical driver. The driver generally comprises a permanent magnet and a voice coil through which an electrical signal is passed from an audio amplifier. Changing voltage in the audio frequency range is applied to the terminals of the voice coil causing a corresponding changing current to flow through the windings of the voice coil. The interaction between the current passing through the voice coil and the magnetic field produced by the permanent magnet causes the voice coil to oscillate in accordance with the electrical signal. Since the voice coil is rigidly attached to the a diaphragm, oscillation of the voice coil causes a corresponding oscillation in the diaphragm to produce acoustical output.

A substantial portion of the impedance associated with electromechanical drivers is caused by the wire that forms the voice coil due to the wire's DC resistance. Accordingly, most of the electrical power applied to the voice coil is converted into heat rather than sound. The ultimate power handling capacity of the voice coil, and thus the loudspeaker, is limited by the ability of the device to tolerate heat. Heat tolerance is generally determined by the lowest melting point of wire insulation and other components, as well as the heat capacity of the adhesive used to construct the voice coil.

The problems produced by heat generation are further compounded by temperature-induced resistance, commonly referred to as power compression. As the temperature of the voice coil increases, the DC resistance of the copper or aluminum conductors or wires used in the voice coil also increases, resulting in progressively decreasing efficiency. For example, a copper wire voice coil that has a DC resistance of eight ohms at 68° C. will have a DC resistance of 16 ohms at 270° C. At 270° C., the voice coil will draw less power from the voltage applied to its terminals, and a substantial portion of the power that it does draw will be converted into heat. Consequently, the loudspeaker, which is a relatively inefficient transducer at room temperature, will be further reduced in efficiency at high voice coil temperatures. This power compression increases as the voltage applied to the voice coil increases, and can reach a point where a further increase in applied voltage results in virtually no increase in acoustical output, only a further increase in heat.

It is therefore desirable to provide a loudspeaker with a voice coil that can be cooled during operation. Reducing voice coil temperature will increase both the efficiency and power capacity of a loudspeaker; as well as its reliability and service life.

The prior art offers different solutions to voice coil cooling. By way of example, U.S. Pat. No. 4,757,547 issued to Danley on Jul. 12, 1988, discloses an air-cooled loudspeaker that has a voice coil positioned in an annular gap formed by pole pieces of a permanent magnet. The voice coil is cooled by directing pressurized air through the gap and over the voice coil. Typically, the clearances between the voice coil and the boundaries of the gap are quite small, usually under 0.020 inch. In order to adequately cool the voice coil, air must be forced through these clearances at a relatively high air flow rate and pressure which, consequently, can cause undesirable noise and distortion in the loudspeaker.

U.S. Pat. No. 5,042,072 issued to Button on Aug. 20, 1991, discloses a self-cooled loudspeaker that has a voice coil positioned in an annular gap between a permanent magnet and a pole piece. Axially extending air channels are formed at particular locations around the circumference of the pole piece to cool portions of the voice coil. Although this structure does not require forcing pressurized air through a relatively small gap, there is a reduction of magnetic flux at the axial air passages since portions of the pole piece have been cut away.

U.S. Pat. No. 5,357,586 issued to Nordschow et al. on Oct. 18, 1994, discloses an air-cooled loudspeaker system having aerodynamically-shaped passages that primarily cool the magnetic structure through induced airflow from vibratory movement of a speaker cone. The only direct cooling of the voice coil results from air flowing in the narrow clearances between the voice coil and the boundaries of the magnetic gap. Because of the relatively low air pressure created by the induced airflow, relatively little air will actually flow over the voice coil to cool it.

SUMMARY OF THE INVENTION

According to the invention, a loudspeaker comprises a speaker frame and a diaphragm connected to the speaker frame for reciprocal movement relative thereto. A generally tubular former is connected to the diaphragm, and a voice coil is connected to the former at a location spaced from the diaphragm. The former is constructed of a thermally conductive material for conducting heat away from the voice coil. A permanent magnet has a central opening and a pole piece has a pole vent opening that is coincident with the central opening. The voice coil is located in a space formed between the permanent magnet and the pole piece. An airflow director is positioned at least partially in the former, with a first gap being formed between the airflow director and an inner surface of the former and a second gap being formed between the airflow director and the pole piece. The first and second gaps are in fluid communication with each other and the pole vent opening such that movement of the diaphragm causes airflow through the first and second gaps and the pole vent opening.

With this construction, heat generated in the coil during operation of the loudspeaker is transferred to the former through conduction, and heat present in the former is transferred through the first and second gaps and the pole vent opening through convection to thereby cool the loudspeaker.

BRIEF DESCRIPTION OF THE SEVERAL VIEWS OF THE DRAWINGS

The preferred embodiments of the present invention will hereinafter be described in conjunction with the appended drawings, wherein.

The invention will now be described in greater detail with reference to the drawings, wherein like parts throughout the drawing figures are represented by like numerals.

DETAILED DESCRIPTION OF THE INVENTION

Figure 1:
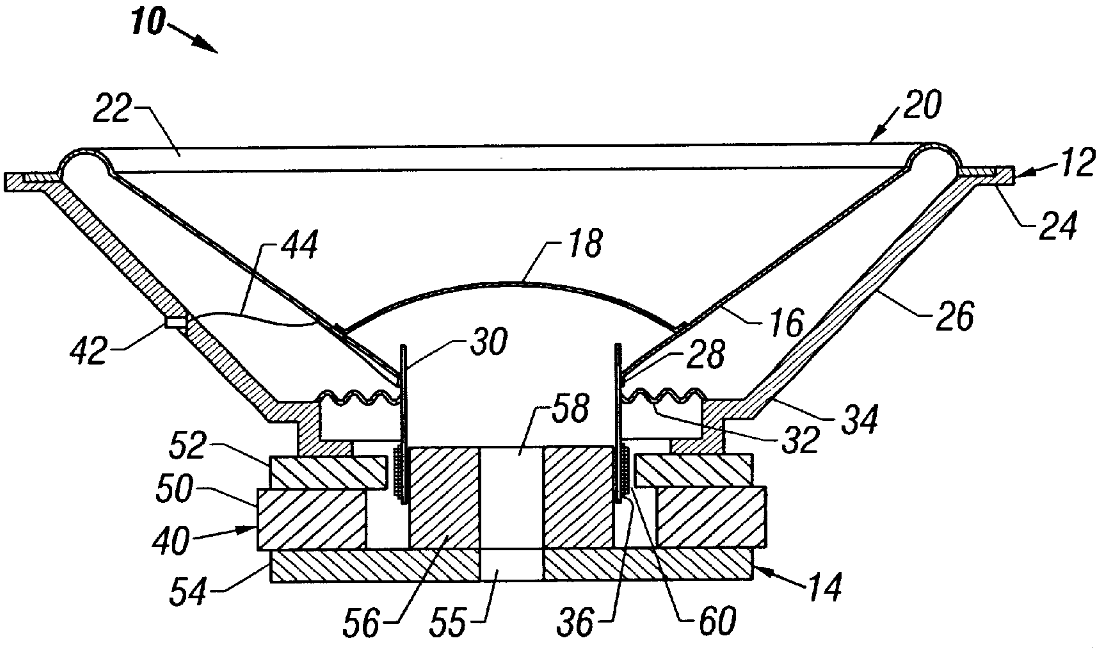
FIG. 1 (Prior Art)
FIG. 1 is a sectional view of a prior art loudspeaker that employs a vented pole piece.
Figure 2:
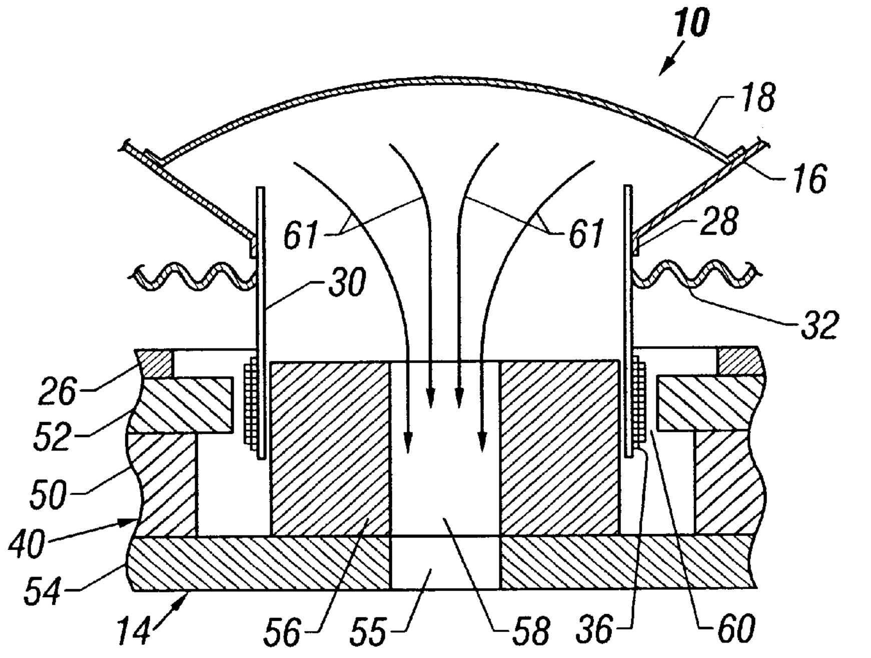
FIG. 2 (Prior Art)
FIG. 2 is an enlarged sectional view of the prior art loudspeaker of FIG. 1 showing air flow through a vent opening in the pole piece.

Referring now to the drawings, and to FIGS. 1 and 2 in particular, a prior art loudspeaker 10 is shown in cross section. The loudspeaker 10 comprises a diaphragm assembly 12 and a driver assembly 14 that operates the diaphragm assembly for producing acoustical output.

The diaphragm assembly 12 includes a cone 16 attached to a dome 18 through adhesive or the like to form a diaphragm 20. The diaphragm 20 has a flexible upper suspension 22 that is connected to an upper end 24 of a rigid frame 26. A lower end 28 of the cone 16 is connected to a former 30 which forms part of the driver assembly 14. The former is in turn connected to the frame 26 through a flexible spider 32 that extends between the former 30 and a lower end 34 of the frame. With this arrangement, the diaphragm 20 is free to move in an axial direction but is restrained from movement in a radial direction with respect to the frame 26.

The driver assembly 14 includes a voice coil 36 mounted on the former 30 and a permanent magnet assembly 40 that cooperates with the voice coil for driving the diaphragm.

The voice coil 36 is typically constructed of aluminum or copper wire and is attached to the former 30 through a conventional adhesive. The voice coil 36 is electrically connected to terminals 42 of the loudspeaker through wires 44.

The permanent magnet assembly 40 is generally annular in shape and is centrally located with respect to a central axis of the diaphragm assembly 12. The permanent magnet assembly 40 includes a permanent magnet 50 disposed between a top plate 52 and a back plate 54. The top plate 52 is rigidly connected to the frame 26. The top and back plates are constructed of a material capable of carrying magnetic flux, such as steel. A pole piece 56 of generally cylindrical shape is connected to the back plate 54 and extends generally toward the diaphragm 20. The pole piece includes a pole vent 58 that is coincident with an opening 55 in the top plate 54. A space or gap 60 is formed between the pole piece 56 and the top plate 52, permanent magnet 50, and back plate 54. The voice coil 36 is positioned in the gap 60.

In use, changing current is applied to the voice coil 36 through the terminals 42. The voice coil 36 in turn produces a magnetic field which interacts with the magnetic field produced by the permanent magnet assembly 40. The interaction of the magnetic fields causes the voice coil 26 to oscillate linearly in accordance with the applied changing current. Oscillation of the voice coil 26 in turn pumps the diaphragm 20 linearly to generate sound. Movement of the diaphragm causes a change in volume of the airspace between the diaphragm assembly 12 and driver assembly 14. When the diaphragm 20 moves away from the pole piece 56, air is drawn toward the diaphragm 20 through the vent opening 55 of the bottom plate 54 and the pole vent opening 58 of the pole piece 56. Likewise, when the diaphragm 20 moves toward the pole piece 56, air is pushed through the pole vent 58 and opening 55, as represented by arrows 61 in FIG. 2. Movement of air through the pole vent 58 in this manner provides some cooling for the pole piece 56, but relatively little or no direct cooling of the voice coil 36.

Figure 3:
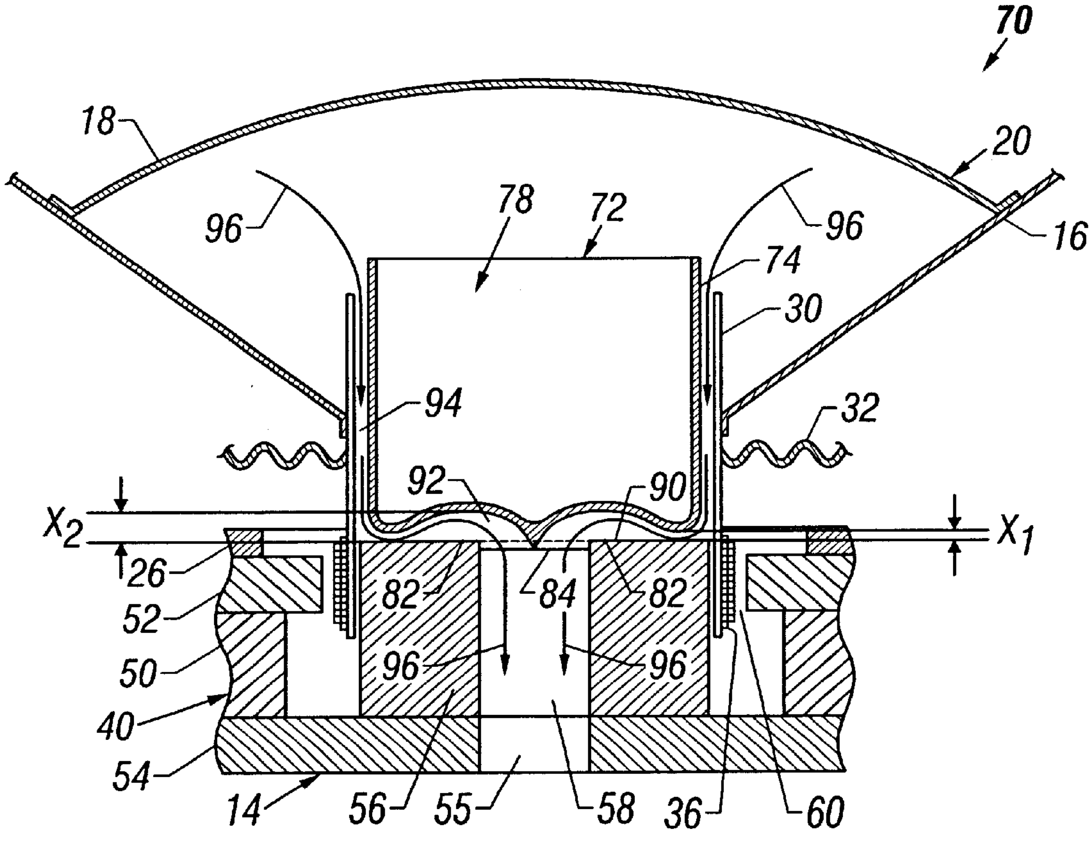
FIG. 3 is a sectional view of a loudspeaker according to a first embodiment of the present invention.

With reference now to FIG. 3, a sectional view of a loudspeaker 70 according to a preferred embodiment of the present invention is illustrated. The loudspeaker 70 includes a generally cup-shaped airflow director 72 that is preferably positioned on the top of the pole piece 56. The airflow director 72 is preferably constructed of a relatively rigid material that exhibits stable material properties at the maximum operating temperature of the loudspeaker 70.

Figure 4:
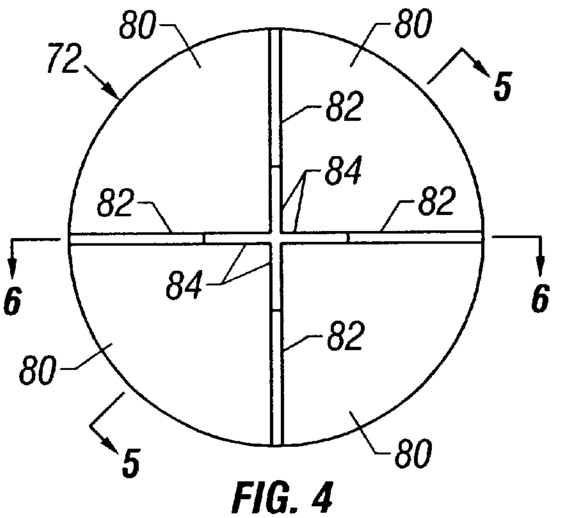
FIG. 4 is a bottom plan view of an airflow director for use in the loudspeaker of FIG. 3.
Figure 5:
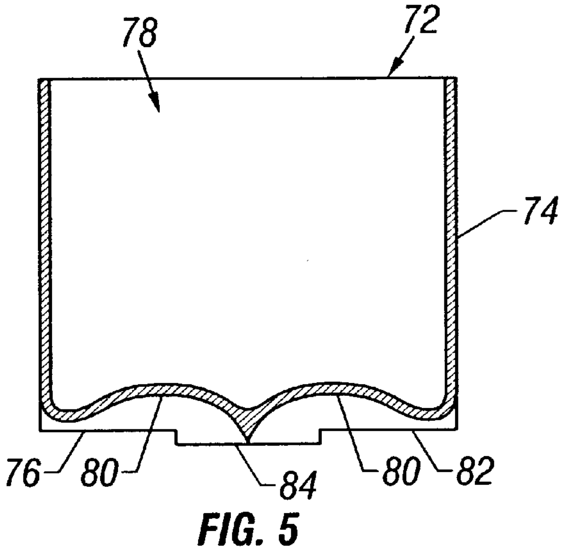
FIG. 5 is sectional view of the airflow director taken along line 5—5 of FIG. 4
Figure 6:
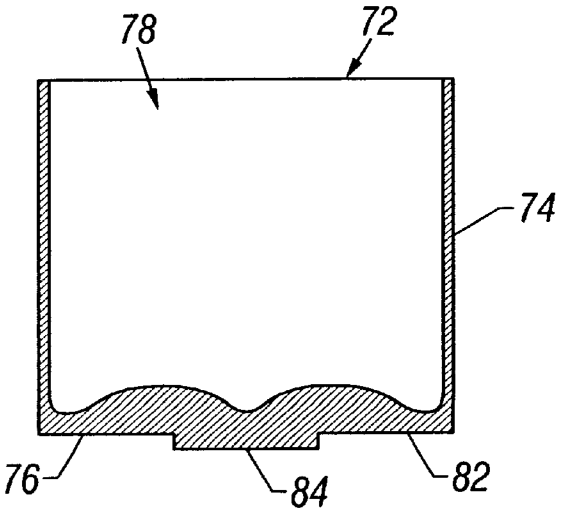
FIG. 6 is a sectional view of the airflow director taken along line 6—6 of FIG. 4.

With additional reference to FIGS. 4–6, the airflow director 72 preferably includes a continuous side wall 74 connected to a bottom wall 76 to form a hollow interior 78. The bottom wall 76 is preferably concave and divided into sectors 80 with a support rib 82 extending between each sector. A raised rib portion 84 is preferably formed on an inner end of each rib 82. Preferably, the support ribs 82 and raised rib portions 84 intersect at the center of the airflow director 72. Each sector 80 is preferably concave in cross section as shown most clearly in FIG. 5.

The ribs 82 of the airflow director 72 are preferably bonded to an upper surface 90 of the pole piece 56 with a suitable high temperature adhesive. The raised rib portions 84 are preferably dimensioned so as to extend into and fit snugly with the pole vent 58. In this manner, the airflow director 72 can be quickly and easily aligned and installed on the pole piece 56 during assembly of the loudspeaker 70. Although four ribs and four sectors are shown, it will be understood that more or less ribs and/or sectors can be provided.

The bottom wall 76, including the ribs 82, is preferably dimensioned and shaped to form a gap 92 between the upper surface 90 of the pole piece 56 and the bottom wall 76. Preferably, the sectors 80 of the bottom wall are concave so that coaxial annular areas of the gap extending between the upper surface 90, of pole piece 56 and the bottom wall 76 and transverse to the direction of air flow are substantially constant across substantially any diameter of the gap. As shown, the distance X1 between the pole piece 56 and the bottom wall 76 at their outer diameters is less than the distance X2 between the pole piece and the bottom wall at a smaller diameter. The constant area is maintained at each annular area in the gap due to the longer circumferential length associated with the distance X1 and the shorter circumferential length associated with the distance X2. Preferably, the substantially constant area of the gap is approximately equal to a cross sectional area of the pole vent 58. The side wall 74 of the air flow director 72 is also preferably dimensioned and shaped to form a gap 94 between the former 30 and the side wall 74. Preferably, the annular areas of the gap 94 are each approximately equal to the cross sectional area of the pole vent 58. With this arrangement, air passing through the gaps 92, 94 and the pole vent 58 will be substantially unrestricted.

In use, air is pumped in and out of the pole vent 58 through the gap 92 adjacent the former 30 during movement of the diaphragm 20. The former 30 is preferably constructed of a thermally conductive material, such as aluminum, so that heat generated by the voice coil 36 is conducted along the former 30 adjacent the gap 94. Heat from the former 30, and thus the voice coil 36, can then be convectively removed from the loudspeaker 70 through air flow in the direction represented by arrows 96 during movement of the diaphragm 20 toward the pole piece 56. Thus, the voice coil 36 can be cooled during operation of the loudspeaker 70 without forcing pressurized air through the relatively narrow gap 60 coincident with the voice coil 36. In this manner, the loudspeaker 70 is capable of operation at higher temperature or electrical power and will have less noise and distortion than the prior art.

Figure 7:
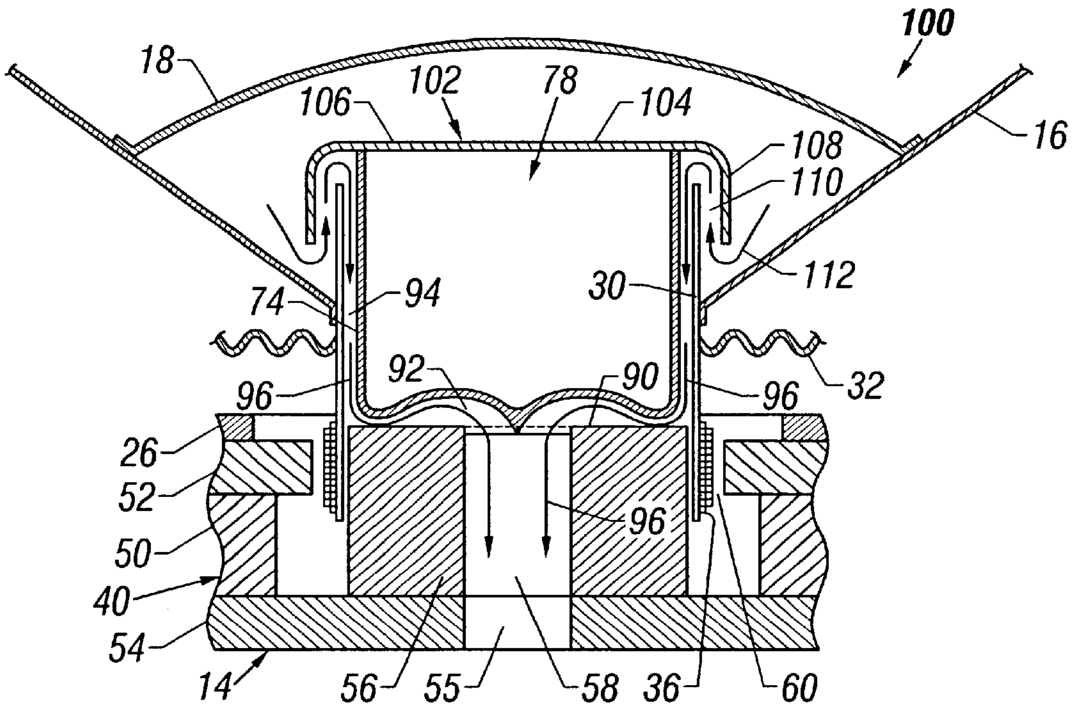
FIG. 7 is a sectional view of a loudspeaker according to a second embodiment of the invention.

With reference now to FIG. 7, a sectional view of a loudspeaker 100 according to a further embodiment of the invention is illustrated. The loudspeaker 100 has a generally cup-shaped airflow director 102 that is preferably positioned on the top of the pole piece 56. The airflow director 102 is similar in configuration to the airflow director 72, with the exception that a generally inverted cup-shaped cap 104 is preferably positioned on a top edge of the continuous wall 74 to enclose the hollow interior 78. As shown, the cap 104 includes an upper wall 106 a continuous side wall 108 that extends downwardly from the upper wall. The upper wall 106 preferably abuts the upper edge of the side wall 74. The side wall 108 of the cap 104 has an inner diameter that is preferably greater than an outer diameter of the side wall 74 such that a gap 110 is formed between an outer surface of the former 30 and an inner surface of the side wall 108.

In use, air that is pumped in and out of the pole vent 58 due to movement of the diaphragm 20 flows in the gaps 92, 94 and 110 adjacent the former 30. Heat generated by the voice coil 36 is conducted along the former 30 adjacent the gaps 94 and 110. Heat from the former 30, and thus the voice coil 36, can then be convectively removed out of the loudspeaker 70 by air flowing in the direction represented by arrows 112 and 96 during movement of the diaphragm 20 toward the pole piece 56. The gap 110 is especially advantageous since the pumped air is directed across both the inner and outer surfaces of the former 30, which functions as a cooling rib, to remove heat from the former 30 through convective heat transfer.

Figure 8:
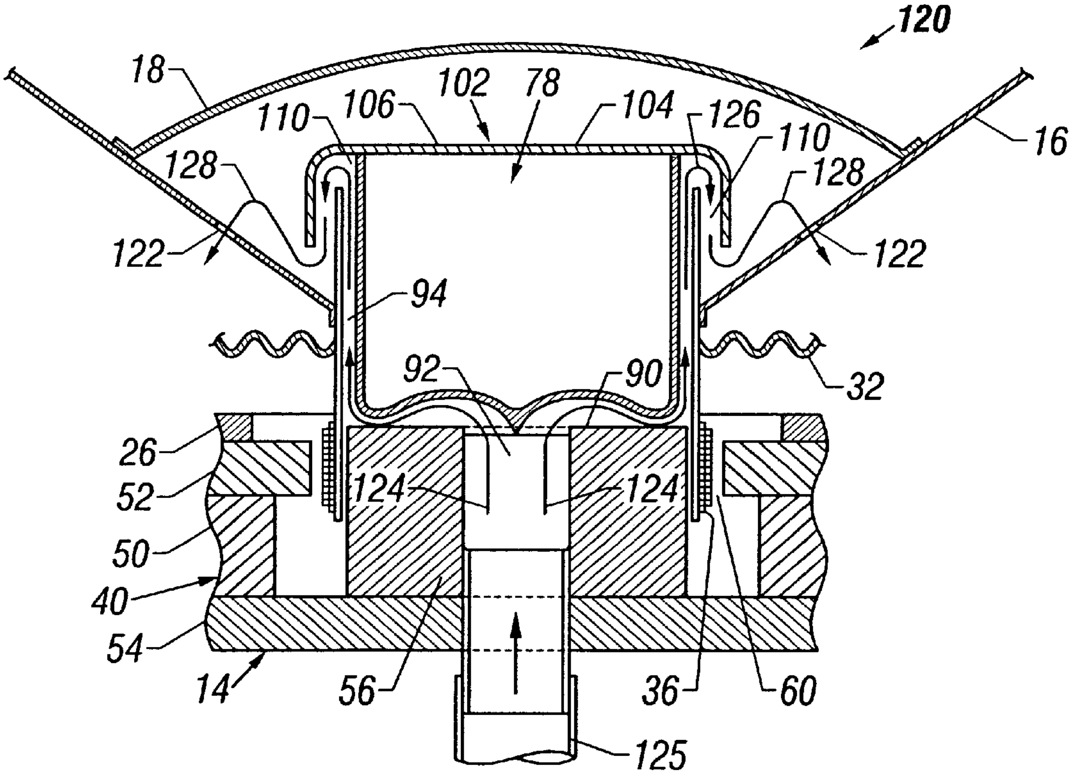
FIG. 8 is a sectional view of a loudspeaker according to a third embodiment of the invention.

With reference now to FIG. 8, a sectional view of a loudspeaker 120 according to a further embodiment of the invention is illustrated. The loudspeaker 120 is similar in construction to the loudspeaker 100 previously described. In this embodiment vent holes 122 are preferably formed in the cone 16 below the dome 18. A tube 125 is in fluid communication with the pole vent 58. The tube 125 is in turn connected to a source of pressurized air (not shown).

In use, air under pressure from the pressurized air source enters the pole vent 58, travels through the gaps 92, 94 and 100, and exits through the vent holes 122 as shown by arrows 124, 126, and 128, respectively. The use of pressurized air in this manner increases the convective transfer of heat from the former 30 beyond that generated by the pumping action of the diaphragm alone, and thus increases the cooling of the voice coil 36.

Figure 9:
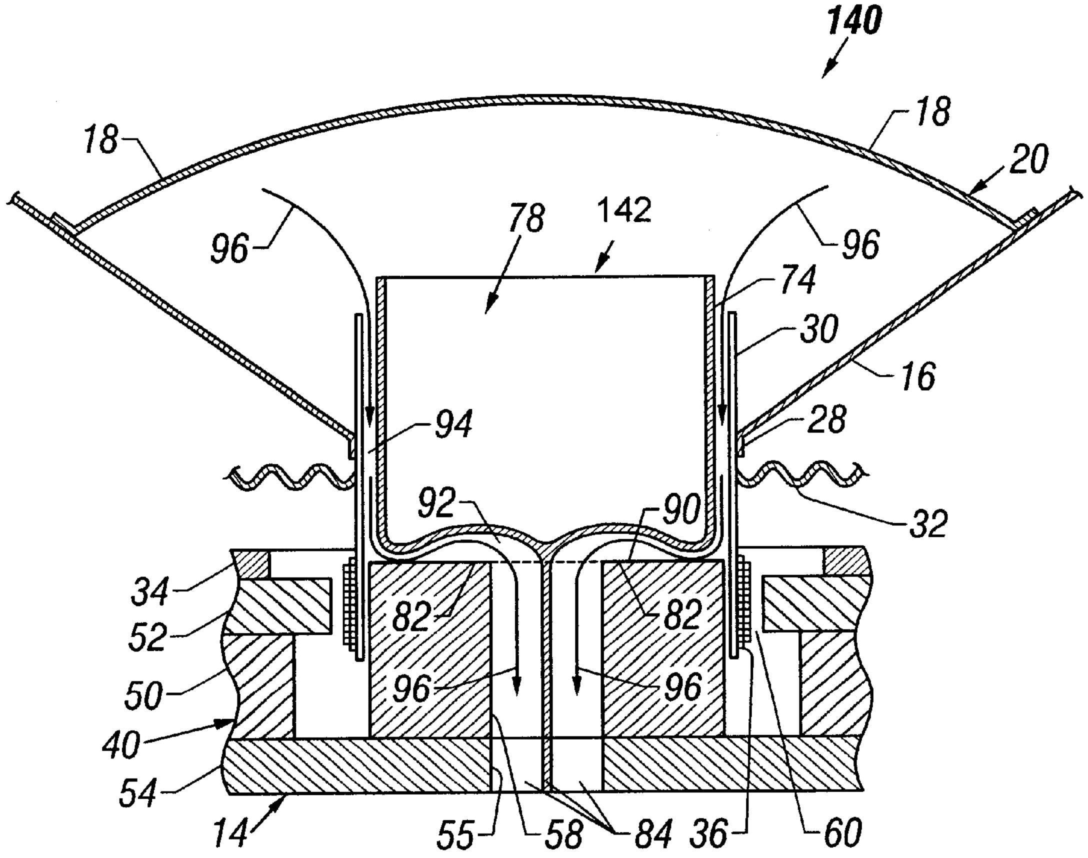
FIG. 9 is a sectional view of a loudspeaker according to a fourth embodiment of the invention.

Turning now to FIG. 9, a sectional view of a loudspeaker 140 according to a further embodiment of the invention is illustrated. The loudspeaker 140 has a generally cup-shaped airflow director 142 that is preferably positioned on the top of the pole piece 56 in a manner similar to the airflow director 72 previously described. The airflow director 142 is preferably constructed of a heat conducting material and is similar in configuration to the airflow director 72, with the exception that the raised rib portions 84 preferably extend along at least a substantial length of the pole vent 58. The raised rib portions 84 may also extend through the opening 55, as shown. The outer edge of each raised rib portion 84 is preferably bonded to the inner surface of the pole vent with a thermally conductive adhesive. Likewise, the ribs 82 of the airflow director 142 are preferably bonded to the upper surface 90 of the pole piece 56 with a thermally conductive adhesive.

In use, a portion of the heat generated by the voice coil 36 is transferred to the pole piece 56 through convection. This heat is then directly conducted to the raised rib portions 84 through conductive heat transfer. Movement of the diaphragm 20 toward the drive assembly 14 causes air to flow through the gaps 94, 92 and the pole vent 58 over the raised rib portions 84 to thereby transfer heat from the raised rib portions 84 and pole piece 56 out of the loudspeaker 140, as well as heat from the former 30 as previously described. Although not shown, a generally inverted cup-shaped cap, as previously described, can be positioned on a top edge of the continuous wall 74 to form a gap to direct air around both sides of the former 30.

Although the airflow director in each of the above embodiments has been shown and described as generally cylindrical, it will be understood that the airflow director can have different shapes.

It will be understood that the terms outer, inner, upper, lower and their respective derivatives and equivalent terms as may be used throughout the specification refer to relative, rather than absolute positions and/or orientations.

While the invention has been taught with specific reference to the above-described embodiments, those skilled in the art will recognize that changes can be made in form and detail without departing from the spirit and the scope of the invention. Thus, the described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A loudspeaker comprising:

a speaker frame;

a diaphragm connected to the speaker frame for reciprocal movement relative thereto;

a generally tubular former connected to the diaphragm;

a voice coil connected to the former at a location spaced from the diaphragm, the former being constructed of a thermally conductive material for conducting heat away from the voice coil;

a permanent magnet having a central opening;

a pole piece having a pole vent opening that is coincident with the central opening, the voice coil being located in a space formed between the permanent magnet and the pole piece; and an airflow director positioned at least partially in the former, with a first gap being formed between the airflow director and an inner surface of the former and a second gap being formed between the airflow director and the pole piece, the first and second gaps being in fluid communication with each other and the pole vent opening such that movement of the diaphragm causes airflow through the first and second gaps and the pole vent opening;

wherein heat generated in the coil during operation of the loudspeaker is transferred to the former through conduction, and heat present in the former is transferred through the first and second gaps and the pole vent opening through convection to thereby cool the loudspeaker.

2. A loudspeaker according to claim 1, wherein the airflow director includes a bottom wall and a first continuous side wall that extends from the bottom wall.

3. A loudspeaker according to claim 2, and further comprising support ribs extending from the bottom wall and resting on the upper surface of the pole piece for spacing the bottom wall from the pole piece to thereby form the second gap.

4. A loudspeaker according to claim 2, and further comprising rib portions connected to the bottom wall and extending into the pole vent opening for aligning the airflow director at least substantially coaxially with the pole piece.

5. A loudspeaker according to claim 4, wherein the rib portions extend at least along a substantial length of the pole vent opening.

6. A loudspeaker according to claim 5, wherein the rib portions are in thermal contact with an inner surface of the vent opening such that heat in the pole piece is transferred by conduction through the rib portions and heat in the rib portions is transferred out of the loudspeaker by convection through the vent opening to thereby cool the pole piece.

7. A loudspeaker according to claim 2, wherein the airflow director further comprises a generally inverted cup-shaped cap having an upper wall connected to a top edge of the first continuous side wall and a second continuous side wall that extends downwardly from the upper wall, the second continuous side wall being sized to extend over an upper end of the former to form a third gap between the second continuous side wall and an outer surface of the former, the third gap being in fluid communication with the second gap such that airflow through the first and second gap removes heat from the inner and outer surfaces, respectively, of the former through convective heat transfer.

8. A loudspeaker according to claim 7, and further comprising:

at least one vent opening formed in the diaphragm; and a source of pressurized air in fluid communication with the pole vent opening;

wherein pressurized air flows through the pole vent opening, the second gap, the first gap, the third gap, and the diaphragm vent opening to thereby cool the loudspeaker.

9. A loudspeaker according to claim 2, wherein the bottom wall is shaped such that coaxial annular areas of the second gap extending between an upper surface of the pole piece and the bottom wall of the airflow director transverse to air flow direction are substantially equal.

10. A loudspeaker according to claim 9, and further comprising support ribs extending from the bottom wall and resting on the upper surface of the pole piece for spacing the bottom wall from the pole piece to thereby form the second gap.

11. A loudspeaker according to claim 10, and further comprising raised rib portions extending from the support ribs and into the pole vent opening for aligning the airflow director at least substantially coaxially with the pole piece.

12. A loudspeaker according to claim 11, wherein the raised rib portions extend at least along a substantial length of the pole vent opening.

13. A loudspeaker according to claim 12, wherein the raised rib portions are in thermal contact with an inner surface of the pole vent opening such that heat in the pole piece is transferred by conduction through the raised rib portions and heat in the raised rib portions is transferred by convection through the pole vent opening and out of the loudspeaker to thereby cool the pole piece.

14. A loudspeaker according to claim 9, wherein each of the annular areas of the second gap are substantially equal to an area of the pole vent opening extending transverse to airflow direction for substantially unimpeded air flow movement through the second gap and vent opening.

15. A loudspeaker according to claim 14 wherein an area of the first gap extending transverse to airflow direction is substantially equal to the pole vent opening area.

16. A loudspeaker according to claim 9, wherein an area of the first gap extending transverse to airflow direction is substantially equal to each of the coaxial annular areas.

17. A loudspeaker according to claim 9, wherein the bottom wall is concave.

18. A loudspeaker according to claim 1, and further comprising:

at least one vent opening formed in the diaphragm; and a source of pressurized air in fluid communication with the pole vent opening;

wherein pressurized air flows at least through the pole vent opening, the second gap, the first gap, and the diaphragm vent opening to thereby remove heat from the loudspeaker through convective heat transfer.

* * * * *